(12) United States Patent
Mello et al.

(10) Patent No.: US 11,830,131 B2
(45) Date of Patent: Nov. 28, 2023

(54) WORKPIECE SENSING FOR PROCESS MANAGEMENT AND ORCHESTRATION

(71) Applicants: Brad C. Mello, Cambridge, MA (US); Paul Jakob Schroeder, Brookline, MA (US); Scott Denenberg, Newton, MA (US); Clara Vu, Cambridge, MA (US)

(72) Inventors: Brad C. Mello, Cambridge, MA (US); Paul Jakob Schroeder, Brookline, MA (US); Scott Denenberg, Newton, MA (US); Clara Vu, Cambridge, MA (US)

(73) Assignee: Veo Robotics, Inc., Waltham, MA (US)

( * ) Notice: Subject to any disclaimer, the term of this patent is extended or adjusted under 35 U.S.C. 154(b) by 563 days.

(21) Appl. No.: 16/868,733

(22) Filed: May 7, 2020

(65) Prior Publication Data

US 2020/0334899 A1    Oct. 22, 2020

Related U.S. Application Data

(63) Continuation-in-part of application No. 15/889,524, filed on Feb. 6, 2018, now Pat. No. 11,040,450.

(51) Int. Cl.
*G06T 17/00*     (2006.01)
*G06T 15/08*     (2011.01)
*G06T 15/00*     (2011.01)

(52) U.S. Cl.
CPC ............ *G06T 17/00* (2013.01); *G06T 15/005* (2013.01); *G06T 15/08* (2013.01)

(58) Field of Classification Search
CPC ........ G06T 17/00; G06T 15/08; G06T 15/005
See application file for complete search history.

(56) References Cited

U.S. PATENT DOCUMENTS

| | | | |
|---|---|---|---|
| 5,790,687 A * | 8/1998 | McLaughlin | D06H 3/08 112/470.06 |
| 9,452,531 B2 * | 9/2016 | Kikkeri | G06T 7/20 |
| 10,445,944 B2 | 10/2019 | Galera et al. | |
| 2002/0064305 A1 * | 5/2002 | Taylor | G06T 7/564 382/154 |
| 2002/0165637 A1 * | 11/2002 | Dillon | G05B 19/4097 700/162 |
| 2004/0186697 A1 * | 9/2004 | Schreier | G05B 19/41885 703/1 |
| 2006/0190712 A1 * | 8/2006 | Frosztega | B01F 15/0404 713/1 |
| 2009/0234502 A1 * | 9/2009 | Ueyama | B25J 9/1697 700/259 |
| 2011/0288667 A1 * | 11/2011 | Noda | G05B 19/42 700/98 |

(Continued)

*Primary Examiner* — Jeff A Burke
*Assistant Examiner* — Kyle T Johnson
(74) *Attorney, Agent, or Firm* — Morgan, Lewis & Bockius LLP

(57) ABSTRACT

Systems and methods for identifying a workpiece in a processing environment may utilize one or more sensors for digitally recording visual information and providing that information to an industrial workflow. The sensor(s) may be positioned to record at least one image of the workpiece at a location where a specified position and orientation thereof is required. A processor may determine, from the recorded image(s) and a stored digital model, whether the workpiece conforms to the specified position and orientation.

19 Claims, 7 Drawing Sheets

(56) References Cited

U.S. PATENT DOCUMENTS

| | | | |
|---|---|---|---|
| 2013/0245828 A1* | 9/2013 | Tateno | G06T 7/75 |
| | | | 700/259 |
| 2014/0192050 A1* | 7/2014 | Qiu | G06K 9/00214 |
| | | | 345/420 |
| 2016/0354927 A1 | 12/2016 | Kikkeri et al. | |
| 2017/0132807 A1* | 5/2017 | Shivaram | B25J 9/1697 |
| 2017/0236262 A1* | 8/2017 | Ohnuki | G06K 9/6253 |
| | | | 700/30 |
| 2017/0302905 A1* | 10/2017 | Shteinfeld | H04N 13/204 |
| 2018/0144458 A1* | 5/2018 | Xu | G06T 7/70 |
| 2018/0173209 A1* | 6/2018 | Iseli | G05B 19/41875 |
| 2018/0345496 A1* | 12/2018 | Li | G06T 17/00 |
| 2019/0262991 A1 | 8/2019 | Sugiyama et al. | |
| 2019/0262993 A1 | 8/2019 | Cole et al. | |
| 2019/0370974 A1* | 12/2019 | Kobayashi | G06T 5/003 |
| 2020/0151286 A1* | 5/2020 | Willis | G06F 30/00 |
| 2020/0164516 A1 | 5/2020 | Lehment et al. | |
| 2020/0334899 A1* | 10/2020 | Mello | G06T 15/08 |

* cited by examiner

WORKPIECE SENSING FOR PROCESS MANAGEMENT AND ORCHESTRATION

CROSS-REFERENCE TO RELATED APPLICATION

This is a continuation-in-part of, and incorporates herein by reference in its entirety, U.S. Ser. No. 15/889,524, filed on Feb. 6, 2018.

FIELD OF THE INVENTION

The field of the invention relates, generally, to monitoring of industrial environments that involve processing of "workpieces" from an initial state to a more (or fully) finished state, and in particular to systems and methods for recognizing the presence, orientation and alignment of workpieces in the course of manufacturing processes.

BACKGROUND

In modern manufacturing processes, workpieces may proceed through a series of process steps that progressively transform the workpiece from raw material into a finished product. At each step (which may occur at a separate station), it is important to determine when the next workpiece arrives and when it is properly seated—e.g., in a fixture or at a desired position on a conveyor line—for processing. This ensures proper execution of the current stage of manufacture as well as downstream "process orchestration." Multiple proximity sensors are typically used to sense workpiece presence and orientation.

A proximity sensor detects the presence of nearby objects without any physical contact. Current sensing approaches in the industry typically either emit an electromagnetic field or a beam of electromagnetic radiation and sense changes in the field or return signal caused by the workpiece. The proximity-sensing modality is selected based on the material properties of the components being sensed. Inductive proximity sensors are used for non-contact detection of metallic objects. An oscillator within the sensor generates an electromagnetic field, and proximity is sensed based on perturbations of the electromagnetic field caused by the presence of a metallic part within the sensing range. Photoelectric sensors, also known as photo-eyes, emit beams of infrared or visible-spectrum light and utilize reflectors to monitor beam-break or sense diffuse reflection from workpieces passing in front of the sensor.

Multiple proximity sensors are typically used to sense if a workpiece is properly nestled in a workholding fixture or located at a desired position on a conveyor line. Higher-level controllers such as programmable logic controllers (PLCs) or manufacturing execution systems (MESs) then perform downstream process orchestration based on the output of the proximity sensor network. For example, in an automotive body-in-white spot-welding process, human operators feed sheet-metal components into "operator load stations." A human operator steps into the feeding station, sets a piece of sheet metal into a workholding fixture, and then steps back outside the zone. Proximity sensors bordering on the periphery of the workholding fixture are triggered when the sheet-metal component is brought within their sensing range. When the human has achieved correct alignment of the workpiece within the fixture, all proximity sensors will have been triggered and a logical condition within a PLC is also triggered. A downstream robotic handling task is then signalled by the PLC, and a robot is dispatched to pick the workpiece from a pre-programmed location to carry out the welding process.

Though in widespread use, proximity sensors have limitations. Inductive and optical sensors are typically one-dimensional devices that are prone to fouling and misalignment due to their close proximity to a manufacturing process. A proximity sensor can only sense distance, and as a consequence, their information resolution is limited; many sensors may be needed to unambiguously ascertain the precise position of a complex workpiece (or a simple workpiece in a complex environment). Accurate sensing may be further complicated by the presence of frames or other bearing fixtures that may partially surround the workpiece and move during its processing. What is needed, therefore, is an approach toward object sensing that can judge object position and orientation based on relatively limited sensed information.

SUMMARY

Embodiments of the present invention determine the position and orientation of a workpiece as it approaches and is handled at a processing station. The invention facilitates the control of manufacturing process-related equipment to achieve desired metrics related to throughput, quality, and overall equipment effectiveness (OEE).

Embodiments of the present invention may be deployed in safety applications for the purposes of mitigation of hazardous situations that may be caused by a machine or robotic system. When used in safety applications, outputs may conform to the requirements outlined in ISO 13849-1:2015 Safety of machinery—Safety-related parts of control systems—Part 1: General principles for design. Embodiments of the present invention may also be deployed in non-safety applications, where there are no claims made to the reliability of the classification algorithms. In these non-safety applications, failures related to the identification process do not lead to unsafe hazardous situations because other safeguarding measures are already in place—for example physical fencing around a machine. The present invention may be used for process orchestration, data collection, dimensional metrology or other non-safety applications that benefit from non-contact 3D workpiece determination.

Accordingly, in a first aspect, the invention pertains to a system for identifying a workpiece in a processing environment. In various embodiments, the system comprises at least one sensor for digitally recording visual information, at least one sensor being positioned to record at least one image of the workpiece at a location where a specified position and orientation thereof is required; a computer memory for storing a digital model of the workpiece; and a processor configured to determine, from the recorded image(s) and the stored digital model, whether the workpiece conforms to the specified position and orientation.

The digital model may include a general representation of the workpiece and a specific representation of the workpiece in the specified position and orientation. The processor may be configured to computationally generate, from at least one recorded image, a 3D spatial representation of the workpiece. The processor may be further configured to generate a 3D voxel-grid volumetric representation of the location.

In various embodiments, the computer memory stores digital models of a plurality of workpieces; the processor may be further configured to recognize a workpiece based on the recorded image(s) and comparison thereof to the stored digital models. The digital models include offset boundaries to reflect workpiece variation and/or tolerances in workpiece position and/or orientation. In some embodiments, the digital model is a spatial representation of the workpiece, e.g., as a mesh generated from a point cloud or CAD representation, whereas in other embodiments, the digital model is a machine-learning representation such as a trained convolutional neural network (CNN). The digital model may include representations of multiple discrete, sequential states.

In another aspect, the invention relates to a method for identifying a workpiece in a processing environment. In various embodiments, the method comprises the steps of digitally recording at least one image of the workpiece where a specified position and orientation thereof is required; storing a digital model of the workpiece; computationally determining, from the at least one recorded image and the stored digital model, whether the workpiece conforms to the specified position and orientation, and only if so, processing the workpiece.

In various embodiments, the digital model includes a general representation of the workpiece and a specific representation of the workpiece in the specified position and orientation. The method may further comprise the step of computationally generating, from at least one recorded image, a 3D spatial representation of the workpiece, and may still further comprise generating a 3D voxel-grid volumetric representation of the location.

In some embodiments, digital models of a plurality of workpieces are stored, and the method also includes the step of computationally recognizing a workpiece based on the recorded image(s) and comparison thereof to the stored digital models. Each of the digital models may include offset boundaries, e.g., to account for workpiece variations. In some embodiments, the digital model is a CAD representation, whereas in other embodiments, the digital model is a machine-learning representation. The digital model may include representations of multiple discrete, sequential states.

The digital model of the workpiece may be created according to steps comprising removing all non-workpiece objects from the processing environment; digitally recording an image of the processing environment as at least one background image; physically moving a workpiece into the processing environment; digitally recording an image of the workpiece in the specified position and orientation; subtracting the background image from the image of the workpiece in the specified position and orientation to produce a difference image; and storing the difference image as the digital model of the workpiece.

In general, as used herein, the term "substantially" means ±10%, and in some embodiments, ±5%. In addition, reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which.

DETAILED DESCRIPTION

In the following discussion, we describe an integrated system for monitoring a workspace, classifying regions therein, dynamically identifying safe states, and identifying and tracking workpieces. In some cases the latter function involves semantic analysis of a robot in the workspace and identification of the workpieces with which it interacts. It should be understood, however, that these various elements may be implemented separately or together in desired combinations; the inventive aspects discussed herein do not require all of the described elements, which are set forth together merely for ease of presentation and to illustrate their interoperability. The system as described represents merely one embodiment.

1. Workspace Monitoring

Figure 1:
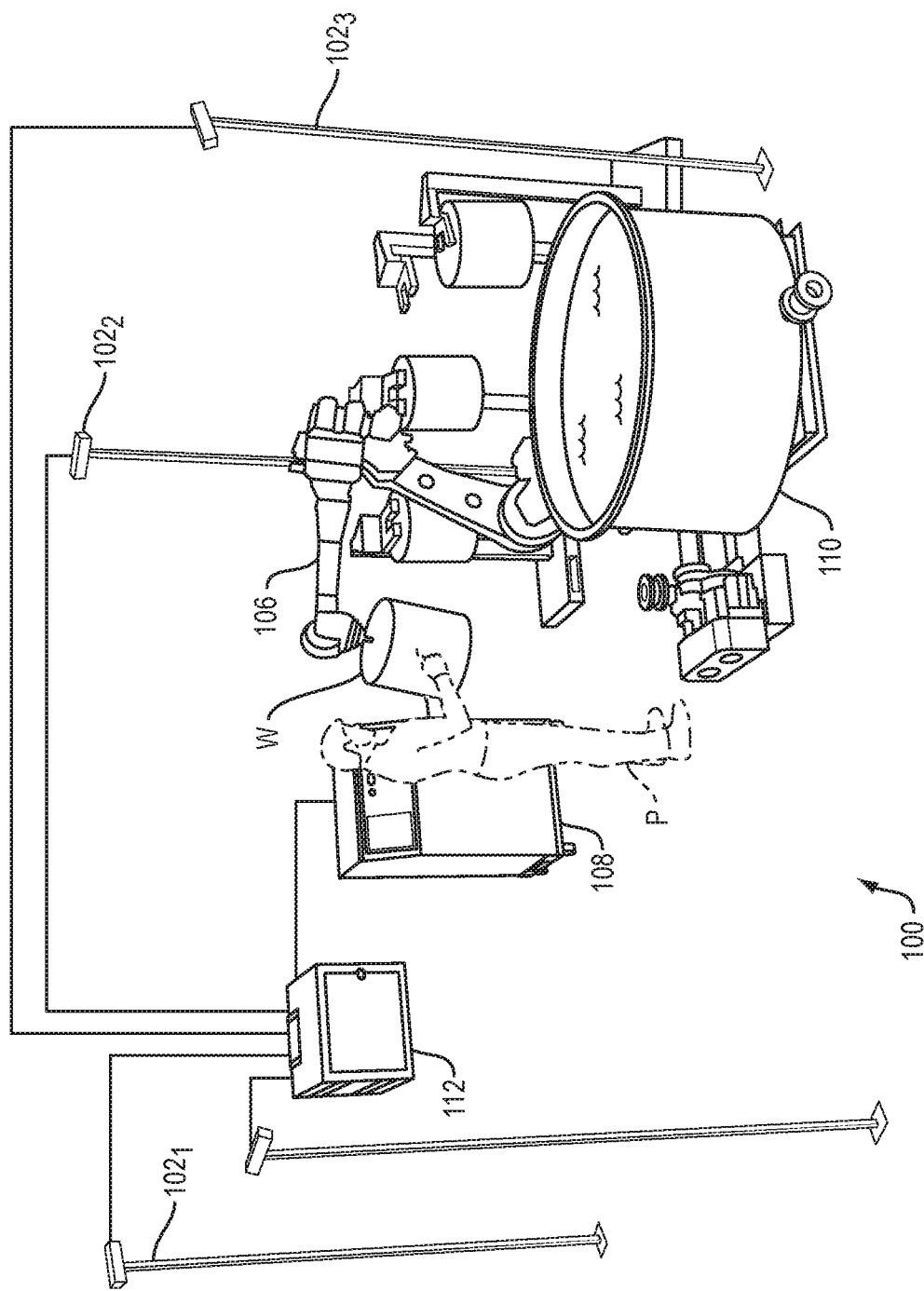
FIG. 1 is a perspective view of a monitored workspace in accordance with an embodiment of the invention.

Refer first to FIG. 1, which illustrates a representative 3D workspace 100 monitored by a plurality of sensors representatively indicated at $102_1$, $102_2$, $102_3$. The sensors 102 may be conventional optical sensors such as cameras, e.g., 3D time-of-flight cameras, stereo vision cameras, or 3D LIDAR sensors or radar-based sensors, ideally with high frame rates (e.g., between 25 FPS and 100 FPS). The mode of operation of the sensors 102 is not critical so long as a 3D representation of the workspace 100 is obtainable from images or other data obtained by the sensors 102. As shown in the figure, sensors 102 collectively cover and can monitor the workspace 100, which includes a robot 106 controlled by a conventional robot controller 108. The robot interacts with various workpieces W, and a person P in the workspace 100 may interact with the workpieces and the robot 108. The workspace 100 may also contain various items of auxiliary equipment 110, which can complicate analysis of the workspace by occluding various portions thereof from the sensors. Indeed, any realistic arrangement of sensors will frequently be unable to "see" at least some portion of an active workspace. This is illustrated in the simplified arrangement of FIG. 1: due to the presence of the person P, at least some portion of robot controller 108 may be occluded from all sensors. In an environment that people traverse and where even stationary objects may be moved from time to time, the unobservable regions will shift and vary.

Figure 2:
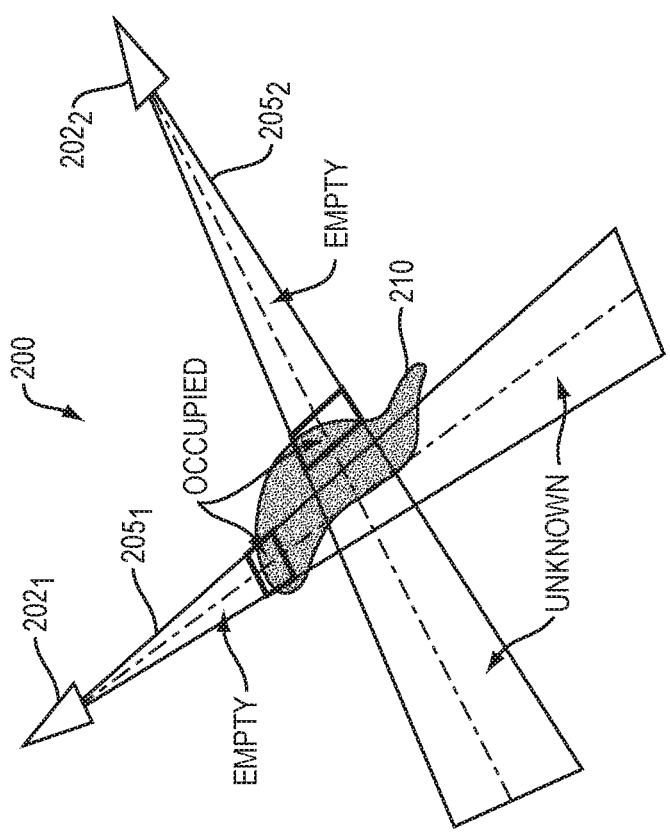
FIG. 2 schematically illustrates classification of regions within the monitored workspace in accordance with an embodiment of the invention.

As shown in FIG. 2, embodiments of the present invention classify workspace regions as occupied, unoccupied (or empty), or unknown. For ease of illustration, FIG. 2 shows two sensors $202_1$, $202_2$ and their zones of coverage $205_1$, $205_2$ within the workspace 200 in two dimensions; similarly, only the 2D footprint 210 of a 3D object is shown. The portions of the coverage zones 205 between the object boundary and the sensors 200 are marked as unoccupied, because each sensor affirmatively detects no obstructions in this intervening space. The space at the object boundary is marked as occupied. In a coverage zone 205 beyond an object boundary, all space is marked as unknown; the corresponding sensor is configured to sense occupancy in this region but, because of the intervening object 210, cannot do so.

With renewed reference to FIG. 1, data from each sensor 102 is received by a control system 112. The volume of space covered by each sensor—typically a solid cone—may be represented in any suitable fashion, e.g., the space may be divided into a 3D grid of small (5 cm, for example) cubes or "voxels" or other suitable form of volumetric representation. For example, workspace 100 may be represented using 2D or 3D ray tracing, where the intersections of the 2D or 3D rays emanating from the sensors 102 are used as the volume coordinates of the workspace 100. This ray tracing can be performed dynamically or via the use of precomputed volumes, where objects in the workspace 100 are previously identified and captured by control system 112. For convenience of presentation, the ensuing discussion assumes a voxel representation; control system 112 maintains an internal representation of the workspace 100 at the voxel level, with voxels marked as occupied, unoccupied, or unknown.

Figure 3:
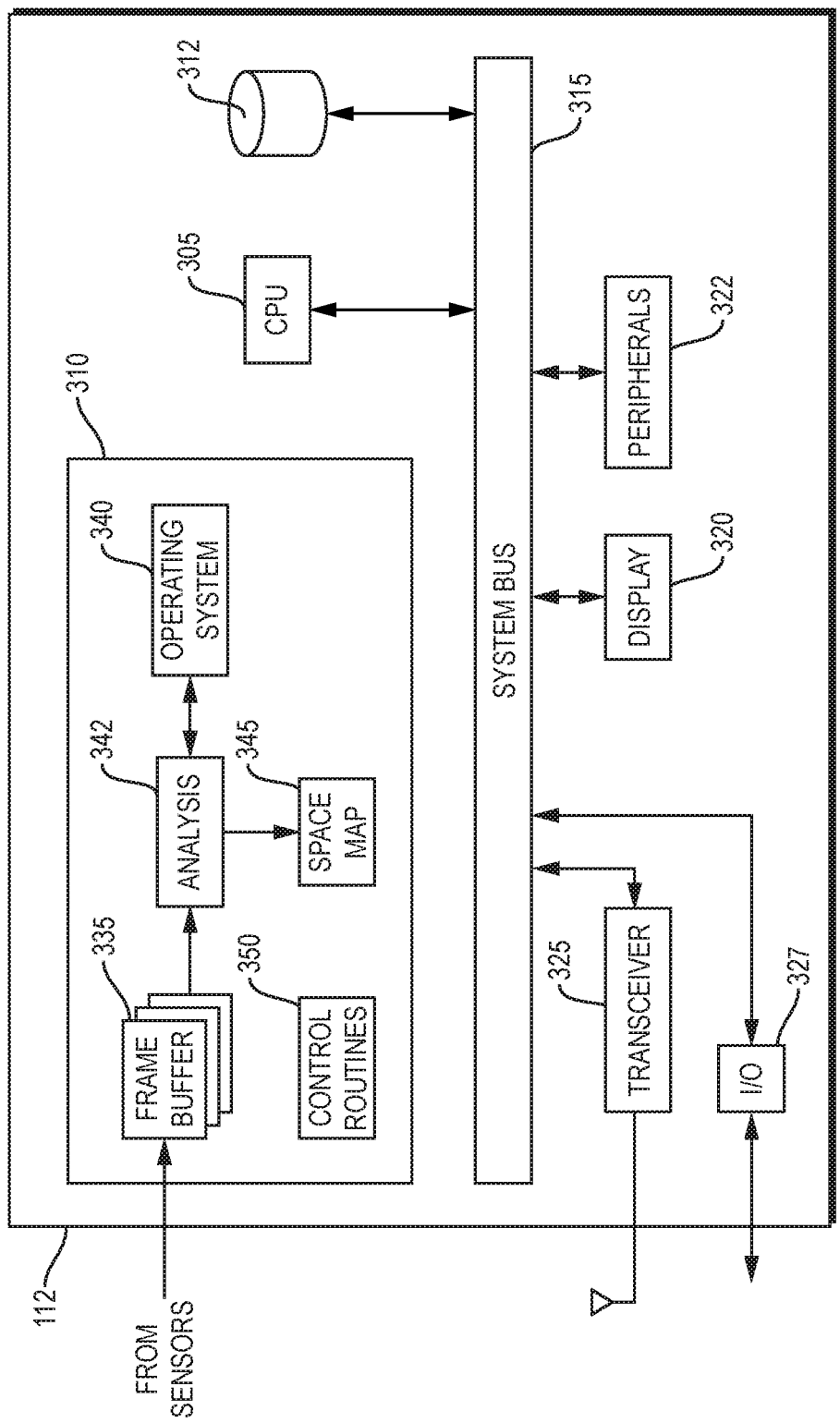
FIG. 3 schematically illustrates a control system in accordance with an embodiment of the invention.

FIG. 3 illustrates, in greater detail, a representative embodiment of control system 112, which may be implemented on a general-purpose computer. The control system 112 includes a central processing unit (CPU) 305, system memory 310, and one or more non-volatile mass storage devices (such as one or more hard disks and/or optical storage units) 312. The system 112 further includes a bidirectional system bus 315 over which the CPU 305, memory 310, and storage device 312 communicate with each other as well as with internal or external input/output (I/O) devices such as a display 320 and peripherals 322, which may include traditional input devices such as a keyboard or a mouse). The control system 112 also includes a wireless transceiver 325 and one or more I/O ports 327. Transceiver 325 and I/O ports 327 may provide a network interface. The term "network" is herein used broadly to connote wired or wireless networks of computers or telecommunications devices (such as wired or wireless telephones, tablets, etc.). For example, a computer network may be a local area network (LAN) or a wide area network (WAN). When used in a LAN networking environment, computers may be connected to the LAN through a network interface or adapter; for example, a supervisor may establish communication with control system 112 using a tablet that wirelessly joins the network. When used in a WAN networking environment, computers typically include a modem or other communication mechanism. Modems may be internal or external, and may be connected to the system bus via the user-input interface, or other appropriate mechanism. Networked computers may be connected over the Internet, an Intranet, Extranet, Ethernet, or any other system that provides communications. Some suitable communications protocols include TCP/IP, UDP, or OSI, for example. For wireless communications, communications protocols may include IEEE 802.11x ("Wi-Fi"), BLUETOOTH, ZIGBEE, IrDa, near-field communication (NFC), or other suitable protocol. Furthermore, components of the system may communicate through a combination of wired or wireless paths, and communication may involve both computer and telecommunications networks.

CPU 305 is typically a microprocessor, but in various embodiments may be a microcontroller, peripheral integrated circuit element, a CSIC (customer-specific integrated circuit), an ASIC (application-specific integrated circuit), a logic circuit, a digital signal processor, a programmable logic device such as an FPGA (field-programmable gate array), PLD (programmable logic device), PLA (programmable logic array), RFID processor, graphics processing unit (GPU), smart chip, or any other device or arrangement of devices that is capable of implementing the steps of the processes of the invention.

The system memory 310 contains a series of frame buffers 335, i.e., partitions that store, in digital form (e.g., as pixels or voxels, or as depth maps), images obtained by the sensors 102; the data may actually arrive via I/O ports 327 and/or transceiver 325 as discussed above. System memory 310 contains instructions, conceptually illustrated as a group of modules, that control the operation of CPU 305 and its interaction with the other hardware components. An operating system 340 (e.g., Windows or Linux) directs the execution of low-level, basic system functions such as memory allocation, file management and operation of mass storage device 312. At a higher level, and as described in greater detail below, an analysis module 342 registers the images in frame buffers 335 and analyzes them to classify regions of the monitored workspace 100. The result of the classification may be stored in a space map 345, which contains a volumetric representation of the workspace 100 with each voxel (or other unit of representation) labeled, within the space map, as described herein. Alternatively, space map 345 may simply be a 3D array of voxels, with voxel labels being stored in a separate database (in memory 310 or in mass storage 312).

Control system 112 may also control the operation or machinery in the workspace 100 using conventional control routines collectively indicated at 350. As explained below, the configuration of the workspace and, consequently, the classifications associated with its voxel representation may well change over time as persons and/or machines move about, and control routines 350 may be responsive to these changes in operating machinery to achieve high levels of safety. All of the modules in system memory 310 may be programmed in any suitable programming language, including, without limitation, high-level languages such as C, C++, C#, Ada, Basic, Cobra, Fortran, Java, Lisp, Perl, Python, Ruby, or low-level assembly languages.

1.1 Sensor Registration

In a typical multi-sensor system, the precise location of each sensor 102 with respect to all other sensors is established during setup. Sensor registration is usually performed automatically, and should be as simple as possible to allow for ease of setup and reconfiguration. Assuming for simplicity that each frame buffer 335 stores an image (which may be refreshed periodically) from a particular sensor 102, analysis module 342 may register sensors 102 by comparing all or part of the image from each sensor to the images from other sensors in frame buffers 335, and using conventional computer-vision techniques to identify correspondences in those images. Suitable global-registration algorithms, which do not require an initial registration approximation, generally fall into two categories: feature-based methods and intensity-based methods. Feature-based methods identify correspondences between image features such as edges while intensity-based methods use correlation metrics between intensity patterns. Once an approximate registration is identified, an Iterative Closest Point (ICP) algorithm or suitable variant thereof may be used to fine-tune the registration.

If there is sufficient overlap between the fields of view of the various sensors 102, and sufficient detail in the workspace 100 to provide distinct sensor images, it may be sufficient to compare images of the static workspace. If this is not the case, a "registration object" having a distinctive signature in 3D can be placed in a location within workspace 100 where it can be seen by all sensors. Alternatively, registration can be achieved by having the sensors 102 record images of one or more people standing in the workspace or walking throughout the workspace over a period of time, combining a sufficient number of partially matching images until accurate registration is achieved.

Registration to machinery within the workspace 100 can, in some cases, be achieved without any additional instrumentation, especially if the machinery has a distinctive 3D shape (for example, a robot arm), so long as the machinery is visible to at least one sensor registered with respect to the others. Alternatively, a registration object can be used, or a user interface, shown in display 320 and displaying the scene observed by the sensors, may allow a user to designate certain parts of the image as key elements of the machinery under control. In some embodiments, the interface provides an interactive 3D display that shows the coverage of all sensors to aid in configuration. If the system is be configured with some degree of high-level information about the machinery being controlled (for purposes of control routines 350, for example)—such as the location(s) of dangerous part or parts of the machinery and the stopping time and/or distance—analysis module 342 may be configured to provide intelligent feedback as to whether the sensors are providing sufficient coverage, and suggest placement for additional sensors.

For example, analysis module 342 can be programmed to determine the minimum distance from the observed machinery at which it must detect a person in order to stop the machinery by the time the person reaches it (or a safety zone around it), given conservative estimates of walking speed. (Alternatively, the required detection distance can be input directly into the system via display 320.) Optionally, analysis module 342 can then analyze the fields of view of all sensors to determine whether the space is sufficiently covered to detect all approaches. If the sensor coverage is insufficient, analysis module 342 can propose new locations for existing sensors, or locations for additional sensors, that would remedy the deficiency. Otherwise, the control system will default to a safe state and control routines 350 will not permit machinery to operate unless analysis module 342 verifies that all approaches can be monitored effectively. Use of machine learning and genetic or evolutionary algorithms can be used to determine optimal sensor placement within a cell. Parameters to optimize include but are not limited to minimizing occlusions around the robot during operation and observability of the robot and workpieces.

If desired, this static analysis may include "background" subtraction. During an initial startup period, when it may be safely assumed there are no objects intruding into the workspace 100, analysis module 342 identifies all voxels occupied by the static elements. Those elements can then be subtracted from future measurements and not considered as potential intruding objects. Nonetheless, continuous monitoring is performed to ensure that the observed background image is consistent with the space map 345 stored during the startup period. Background can also be updated if stationary objects are removed or are added to the workspace There may be some areas that sensors 102 cannot observe sufficiently to provide safety, but that are guarded by other methods such as cages, etc. In this case, the user interface can allow the user to designate these areas as safe, overriding the sensor-based safety analysis. Safety-rated soft-axis and rate limitations can also be used to limit the envelope of the robot to improve performance of the system.

Once registration has been achieved, sensors 102 should remain in the same location and orientation while the workspace 100 is monitored. If one or more sensors 102 are accidentally moved, the resulting control outputs will be invalid and could result in a safety hazard. Analysis module 342 may extend the algorithms used for initial registration to monitor continued accuracy of registration. For example, during initial registration analysis module 342 may compute a metric capturing the accuracy of fit of the observed data to a model of the work cell static elements that is captured during the registration process. As the system operates, the same metric can be recalculated. If at any time that metric exceeds a specified threshold, the registration is considered to be invalid and an error condition is triggered; in response, if any machinery is operating, a control routine 350 may halt it or transition the machinery to a safe state.

1.2 Identifying Occupied and Potentially Occupied Areas

Once the sensors have been registered, control system 112 periodically updates space map 345—at a high fixed frequency (e.g., every analysis cycle) in order to be able to identify all intrusions into workspace 100. Space map 345 reflects a fusion of data from some or all of the sensors 102. But given the nature of 3D data, depending on the locations of the sensors 102 and the configuration of workspace 100, it is possible that an object in one location will occlude the sensor's view of objects in other locations, including objects (which may include people or parts of people, e.g. arms) that are closer to the dangerous machinery than the occluding object. Therefore, to provide a reliably safe system, the system monitors occluded space as well as occupied space.

In one embodiment, space map 345 is a voxel grid. In general, each voxel may be marked as occupied, unoccupied or unknown; only empty space can ultimately be considered safe, and only when any additional safety criteria—e.g., minimum distance from a piece of controlled machinery—is satisfied. Raw data from each sensor is analyzed to determine whether, for each voxel, an object or boundary of the 3D mapped space has been definitively detected in the volume corresponding to that voxel. To enhance safety, analysis module 342 may designate as empty only voxels that are observed to be empty by more than one sensor 102. Again, all space that cannot be confirmed as empty is marked as unknown. Thus, only space between a sensor 102 and a detected object or mapped 3D space boundary along a ray may be marked as empty.

If a sensor detects anything in a given voxel, all voxels that lie on the ray beginning at the focal point of that sensor and passing through the occupied voxel, and which are between the focal point and the occupied voxel, are classified as unoccupied, while all voxels that lie beyond the occupied voxel on that ray are classified as occluded for that sensor; all such occluded voxels are considered "unknown." Information from two or more sensors may be combined to determine which areas are occluded from the sensors; these areas are considered unknown and therefore unsafe. Analysis module 342 may finally mark as "unoccupied" only voxels or workspace volumes that have been preliminarily marked at least once (or, in some embodiments, at least twice) as "unoccupied." Based on the markings associated with the voxels or discrete volumes within the workspace, analysis module 342 may map one or more safe volumetric zones within space map 345. These safe zones are outside a safety zone of the machinery and include only voxels or workspace volumes marked as unoccupied.

A common failure mode of active optical sensors that depend on reflection, such as LIDAR and time-of-flight cameras, is that they do not return any signal from surfaces that are insufficiently reflective, and/or when the angle of incidence between the sensor and the surface is too shallow. This can lead to a dangerous failure because this signal can be indistinguishable from the result that is returned if no obstacle is encountered; the sensor, in other words, will report an empty voxel despite the possible presence of an obstacle. This is why ISO standards for e.g. 2D LIDAR sensors have specifications for the minimum reflectivity of objects that must be detected; however, these reflectivity standards can be difficult to meet for some 3D sensor modalities such as time-of-flight. In order to mitigate this failure mode, analysis module 342 marks space as empty only if some obstacle is definitively detected at further range along the same ray. By pointing sensors slightly downward so that most of the rays will encounter the floor if no obstacles are present, it is possible to conclusively analyze most of the workspace 100. But if the sensed light level in a given voxel is insufficient to definitively establish emptiness or the presence of a boundary, the voxel is marked as unknown. The signal and threshold value may depend on the type of sensor being used. In the case of an intensity-based 3D sensor (for example, a time-of-flight camera) the threshold value can be a signal intensity, which may be attenuated by objects in the workspace of low reflectivity. In the case of a stereo vision system, the threshold may be the ability to resolve individual objects in the field of view. Other signal and threshold value combinations can be utilized depending on the type of sensor used.

A safe system can be created by treating all unknown space as though it were occupied. However, in some cases this may be overly conservative and result in poor performance. It is therefore desirable to further classify unknown space according to whether it could potentially be occupied. As a person moves within a 3D space, he or she will typically occlude some areas from some sensors, resulting in areas of space that are temporarily unknown (see FIG. 1). Additionally, moving machinery such as an industrial robot arm can also temporarily occlude some areas. When the person or machinery moves to a different location, one or more sensors will once again be able to observe the unknown space and return it to the confirmed-empty state in which it is safe for the robot or machine to operate. Accordingly, in some embodiments, space may also be classified as "potentially occupied." Unknown space is considered potentially occupied when a condition arises where unknown space could be occupied. This could occur when unknown space is adjacent to entry points to the workspace or if unknown space is adjacent to occupied or potentially occupied space. The potentially occupied space "infects" unknown space at a rate that is representative of a human moving through the workspace. Potentially occupied space stays potentially occupied until it is observed to be empty. For safety purposes, potentially occupied space is treated the same as occupied space. It may be desirable to use probabilistic techniques such as those based on Bayesian filtering to determine the state of each voxel, allowing the system to combine data from multiple samples to provide higher levels of confidence in the results. Suitable models of human movement, including predicted speeds (e.g., an arm may be raised faster than a person can walk), are readily available.

2. Classifying Objects

For many applications, the classification of regions in a workspace as described above may be sufficient—e.g., if control system 112 is monitoring space in which there should be no objects at all during normal operation. In many cases, however, it is desirable to monitor an area in which there are at least some objects during normal operation, such as one or more machines and workpieces on which the machine is operating. In these cases, analysis module 342 may be configured to identify intruding objects that are unexpected or that may be humans. One suitable approach to such classification is to cluster individual occupied voxels into objects that can be analyzed at a higher level.

To achieve this, analysis module 342 may implement any of several conventional, well-known clustering techniques such as Euclidean clustering, K-means clustering and Gibbs-sampling clustering. Any of these or similar algorithms can be used to identify clusters of occupied voxels from 3D point cloud data. Mesh techniques, which determine a mesh that best fits the point-cloud data and then use the mesh shape to determine optimal clustering, may also be used. Once identified, these clusters can be useful in various ways.

One simple way clustering can be used is to eliminate small groups of occupied or potentially occupied voxels that are too small to possibly contain a person. Such small clusters may arise from occupation and occlusion analysis, as described above, and can otherwise cause control system 112 to incorrectly identify a hazard. Clusters can be tracked over time by simply associating identified clusters in each image frame with nearby clusters in previous frames or using more sophisticated image-processing techniques. The shape, size, or other features of a cluster can be identified and tracked from one frame to the next. Such features can be used to confirm associations between clusters from frame to frame, or to identify the motion of a cluster. This information can be used to enhance or enable some of the classification techniques described below. Additionally, tracking clusters of points can be employed to identify incorrect and thus potentially hazardous situations. For example, a cluster that was not present in previous frames and is not close to a known border of the field of view may indicate an error condition.

In some cases it may be sufficient to filter out clusters below a certain size and to identify cluster transitions that indicate error states. In other cases, however, it may be necessary to further classify objects into one or more of four categories: (1) elements of the machinery being controlled by system 112, (2) the workpiece or workpieces that the machinery is operating on, and (3) other foreign objects, including people, that may be moving in unpredictable ways and that can be harmed by the machinery. It may or may not be necessary to conclusively classify people versus other unknown foreign objects. It may be necessary to definitively identify elements of the machinery as such, because by definition these will always be in a state of "collision" with the machinery itself and thus will cause the system to erroneously stop the machinery if detected and not properly classified. Similarly, machinery typically comes into contact with workpieces, but it is typically hazardous for machinery to come into contact with people. Therefore, analysis module 342 should be able to distinguish between workpieces and unknown foreign objects, especially people.

Elements of the machinery itself may be handled for classification purposes by the optional background-subtraction calibration step described above. In cases where the machinery changes shape, elements of the machinery can be identified and classified, e.g., by supplying analysis module

342 with information about these elements (e.g., as scalable 3D representations), and in some cases (such as industrial robot arms) providing a source of instantaneous information about the state of the machinery. Analysis module 342 may be "trained" by operating machinery, conveyors, etc. in isolation under observation by the sensors 102, allowing analysis module 342 to learn their precise regions of operation resulting from execution of the full repertoire of motions and poses. Analysis module 342 may classify the resulting spatial regions as occupied.

Conventional computer-vision techniques may be employed to enable analysis module 342 to distinguish between workpieces and humans. These include deep learning, a branch of machine learning designed to use higher levels of abstraction in data. The most successful of these deep-learning algorithms have been CNNs and, more recently, recurrent neural networks (RNNs). However, such techniques are generally employed in situations where accidental misidentification of a human as a non-human does not cause safety hazards. In order to use such techniques in the present environment, a number of modifications may be needed. First, machine-learning algorithms can generally be tuned to prefer false positives or false negatives (for example, logistic regression can be tuned for high specificity and low sensitivity). False positives in this scenario do not create a safety hazard—if the robot mistakes a workpiece for a human, it will react conservatively. Additionally, multiple algorithms or neural networks based on different image properties can be used, promoting the diversity that may be key to achieving sufficient reliability for safety ratings. One particularly valuable source of diversity can be obtained by using sensors that provide both 3D and 2D image data of the same object. If any one technique identifies an object as human, the object will be treated as human. Using multiple techniques or machine-learning algorithms, all tuned to favor false positives over false negatives, sufficient reliability can be achieved. In addition, multiple images can be tracked over time, further enhancing reliability—and again every object can be treated as human until enough identifications have characterized it as non-human to achieve reliability metrics. Essentially, this diverse algorithmic approach, rather than identifying humans, identifies things that are definitely not humans.

In addition to combining classification techniques, it is possible to identify workpieces in ways that do not rely on any type of human classification at all. One approach is to configure the system by providing models of workpieces. For example, a "teaching" step in system configuration may simply supply images or key features of a workpiece to analysis module 342, which searches for matching configurations in space map 345, or may instead involve training of a neural network to automatically classify workpieces as such in the space map. In either case, only objects that accurately match the stored model are treated as workpieces, while all other objects are treated as humans.

Another suitable approach is to specify particular regions within the workspace, as represented in the space map 345, where workpieces will enter (such as the top of a conveyor belt). Only objects that enter the workspace in that location are eligible for treatment as workpieces. The workpieces can then be modeled and tracked from the time they enter the workspace until the time they leave. While a monitored machine such as a robot is handling a workpiece, control system 112 ensures that the workpiece is moving only in a manner consistent with the expected motion of the robot end effector. Known equipment such as conveyor belts can also be modeled in this manner. Humans may be forbidden from entering the work cell in the manner of a workpiece—e.g., sitting on conveyors.

All of these techniques can be used separately or in combination, depending on design requirements and environmental constraints. In all cases, however, there may be situations where analysis module 342 loses track of whether an identified object is a workpiece. In these situations the system should fall back to a safe state. An interlock can then be placed in a safe area of the workspace where a human worker can confirm that no foreign objects are present, allowing the system to resume operation.

In some situations a foreign object enters the workspace, but subsequently should be ignored or treated as a workpiece. For example, a stack of boxes that was not present in the workspace at configuration time may subsequently be placed therein. This type of situation, which will become more common as flexible systems replace fixed guarding, may be addressed by providing a user interface (e.g., shown in display 320 or on a device in wireless communication with control system 112) that allows a human worker to designate the new object as safe for future interaction. Of course, analysis module 342 and control routines 350 may still act to prevent the machinery from colliding with the new object, but the new object will not be treated as a potentially human object that could move towards the machinery, thus allowing the system to handle it in a less conservative manner.

The foregoing approach may be refined to permit a computer vision system not only to identify a workpiece but also judge its position and orientation to recognize proper positioning and alignment. Training is enhanced to make the analysis sensitive to these characteristics within the manufacturing environment. This can involve explicit 2D or 3D computer-aided design (CAD) models of the workpieces in the proper position and orientation or training a neural network with many actual and/or synthetic images of such workpieces. Arrangements involving multiple workpieces may also be employed. The results of training are saved in memory and recalled for future use. This process is described in greater detail below.

3. Generating Control Outputs

At this stage, analysis module 342 has identified all objects in the monitored area 100 that must be considered. Given this data, a variety of actions can be taken and control outputs generated. During static calibration or with the workspace in a default configuration free of humans, space map 345 may be useful to a human for evaluating sensor coverage, the configuration of deployed machinery, and opportunities for unwanted interaction between humans and machines. Even without setting up cages or fixed guards, the overall workspace layout may be improved by channeling or encouraging human movement through the regions marked as safe zones, as described above, and away from regions with poor sensor coverage.

Control routines 350, responsive to analysis module 342, may generate control signals to operating machinery, such as robots, within workspace 100 when certain conditions are detected. This control can be binary, indicating either safe or unsafe conditions, or can be more complex, such as an indication of what actions are safe and unsafe. The simplest type of control signal is a binary signal indicating whether an intrusion of either occupied or potentially occupied volume is detected in a particular zone. In the simplest case, there is a single intrusion zone and control system 112 provides a single output indicative of an intrusion. This output can be delivered, for example, via an I/O port 327 to a complementary port on the controlled machinery to stop or limit the operation of the machinery. In more complex scenarios, multiple zones are monitored separately, and a control routine 350 issues a digital output via an I/O port 327 or transceiver 325 addressed, over a network, to a target piece of machinery (e.g., using the Internet protocol or other suitable addressing scheme).

Another condition that may be monitored is the distance between any object in the workspace and a machine, comparable to the output of a 2D proximity sensor. This may be converted into a binary output by establishing a proximity threshold below which the output should be asserted. It may also be desirable for the system to record and make available the location and extent of the object closest to the machine. In other applications, such as a safety system for collaborative industrial robotics, the desired control output may include the location, shape, and extent of all objects observed within the area covered by the sensors 102.

Another condition that may be monitored is the presence of workpieces in a location that the system has been trained to recognize. Workpieces may be individually monitored or added to collections or groupings based on particular process requirements. For example, some palletizing applications pick one box at a time, warranting individual monitoring, while in other applications, boxes are picked three at a time, and a collection of three individually tracked objects would be more appropriate. Variants of the same object may occupy the monitored position such as the end of a conveyor line. In other instances, logical conditions related to the presence of multiple objects in different locations must be met prior to generating control outputs, e.g., an action may be prevented until a certain number of workpieces have arrived at a designated location.

4. Safe Action Constraints and Dynamic Determination of Safe Zones

ISO 10218 and ISO/TS 15066 describe speed and separation monitoring as a safety function that can enable collaboration between an industrial robot and a human worker. Risk reduction is achieved by maintaining at least a protective separation distance between the human worker and robot during periods of robot motion. This protective separation distance is calculated using information including robot and human worker position and movement, robot stopping distance, measurement uncertainty, system latency and system control frequency. When the calculated separation distance decreases to a value below the protective separation distance, the robot system is stopped. This methodology can be generalized beyond industrial robotics to machinery.

For convenience, the following discussion focuses on dynamically defining a safe zone around a robot operating in the workspace 100. It should be understood, however, that the techniques described herein apply not only to multiple robots but to any form of machinery that can be dangerous when approached too closely, and which has a minimum safe separation distance that may vary over time and with particular activities undertaken by the machine. As described above, a sensor array obtains sufficient image information to characterize, in 3D, the robot and the location and extent of all relevant objects in the area surrounding the robot at each analysis cycle. (Each analysis cycle includes image capture, refresh of the frame buffers, and computational analysis; accordingly, although the period of the analysis or control cycle is short enough for effective monitoring to occur in real time, it involves many computer clock cycles.) Analysis module 342 utilizes this information along with instantaneous information about the current state of the robot at each cycle to determine instantaneous, current safe action constraints for the robot's motion. The constraints may be communicated to the robot, either directly by analysis module 342 or via a control routine 350, to the robot via transceiver 325 and/or I/O port 327.

5. Object Characterization and Tracking

Figure 4A:
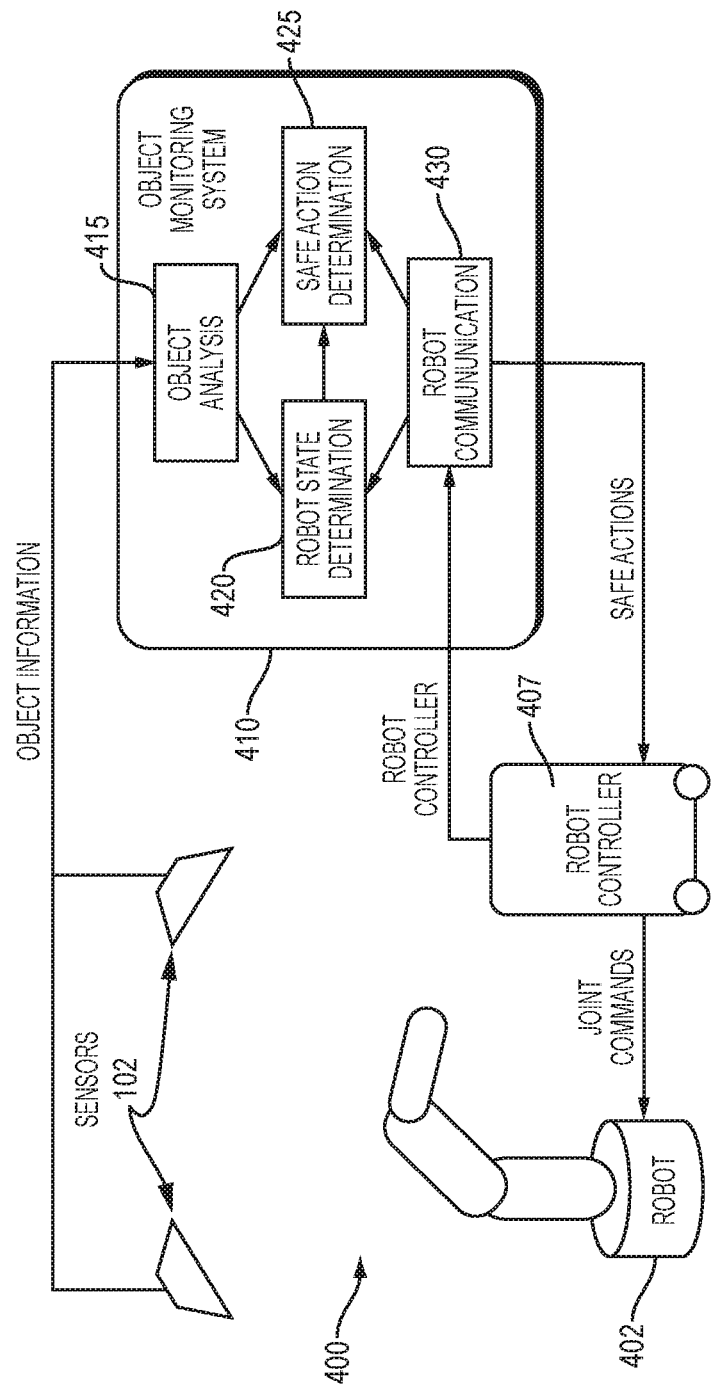
FIGS. 4A-4E schematically illustrate object-monitoring systems in accordance with various embodiments of the invention.

The operation of the system is best understood with reference to the conceptual illustration of system organization and operation of FIG. 4A. As described above, a sensor array 102 monitors the workspace 400, which includes a robot 402. The robot's movements are controlled by a conventional robot controller 407, which may be part of or separate from the robot itself; for example, a single robot controller may issue commands to more than one robot. The robot's activities may primarily involve a robot arm, the movements of which are orchestrated by robot controller 407 using joint commands that operate the robot arm joints to effect a desired movement. An object-monitoring system (OMS) 410 obtains information about objects from the sensors 102 and uses this sensor information to identify relevant objects in the workspace 400. OMS 410 communicates with robot controller 407 via any suitable wired or wireless protocol. (In an industrial robot, control electronics typically reside in an external control box. However, in the case of a robot with a built-in controller, OMS 410 communicates directly with the robot's onboard controller.) Using information obtained from the robot (and, typically, sensors 102), OMS 410 determines the robot's current state. OMS 410 thereupon determines safe-action constraints for robot 402 given the robot's current state and all identified relevant objects. Finally, OMS 410 communicates safe action constraints to robot 407. (It will be appreciated that, with reference to FIG. 3, the functions of OMS 410 are performed in a control system 112 by analysis module 342 and, in some cases, a control routine 350.)

5.1 Identifying Relevant Objects

The sensors 102 provide real-time image information that is analyzed by an object-analysis module 415 at a fixed frequency in the manner discussed above; in particular, at each cycle, object analysis module 415 identifies the precise 3D location and extent of all objects in workspace 400 that are either within the robot's reach or that could move into the robot's reach at conservative expected velocities. If not all of the relevant volume is within the collective field of view of the sensors 102, OMS 410 may be configured to so determine and indicate the location and extent of all fixed objects within that region (or a conservative superset of those objects) and/or verify that other guarding techniques have been used to prevent access to unmonitored areas.

5.2 Determining Workpiece Position and Orientation

Object analysis module 415 can be trained to recognize the desired configurations of workpieces by physically positioning the workpieces in the monitored zone where the sensors are actively monitoring the space. By subtracting a trained nominal background image from frames where workpieces are also present, object analysis module 415 performs segmentation and voxel-grid dissection to distinguish the properly positioned configuration of workpieces from the background.

Beginning with a 3D voxel-grid volumetric representation of a space, a series of image-capturing steps may be used to successfully train object analysis module 415 to recognize properly positioned and oriented 2D workpiece faces or 3D workpiece volumes. Object analysis module 415 may further be trained to recognize a location of a properly oriented object, e.g., relative to other objects and/or to surrounding features such as a boundary. During training, the user sets workpieces in their proper positions and orientations and signals approval; the image recorded by each sensor 102 is saved in memory as a comparison template associated with the specific type of workpiece (which is represented as an object). If multiple workpieces are processed (or their positions and orientations evaluated) simultaneously, the collection of objects may be approved and stored. After being saved into memory, trained objects and collections of objects may be recalled for additional editing and reclassification steps. Basic boolean operations to combine bodies may be performed on the trained objects in addition to more complex addition and subtraction of individual voxels using a conventional CAD modeling tool. An offsetting tool may be used to adjust the boundary of the workpiece by a configurable number of voxels. This boundary offsetting step may be performed to account for multiple workpiece variants, part-to-part tolerance stack up or variance, or to influence the sensitivity of object analysis module 415 to the sensed object(s). Alternatively, conventional techniques of image data augmentation can be employed to translate and rotate by small amounts the workpiece images captured by the different sensors, thereby establishing the range of acceptable variations in position and orientation.

The digital model may include representations of multiple discrete, sequential states; in the limit, these states may form a video sequence of frames recorded as the workpiece moves through a production step. For example, a user interface may allow the user to pause the recording at any time and choose to record the current state of the workpiece into memory as a discrete object. An alternative option in the continuous mode is to allow the object to change in real time based on the recorded data.

Figure 4B:
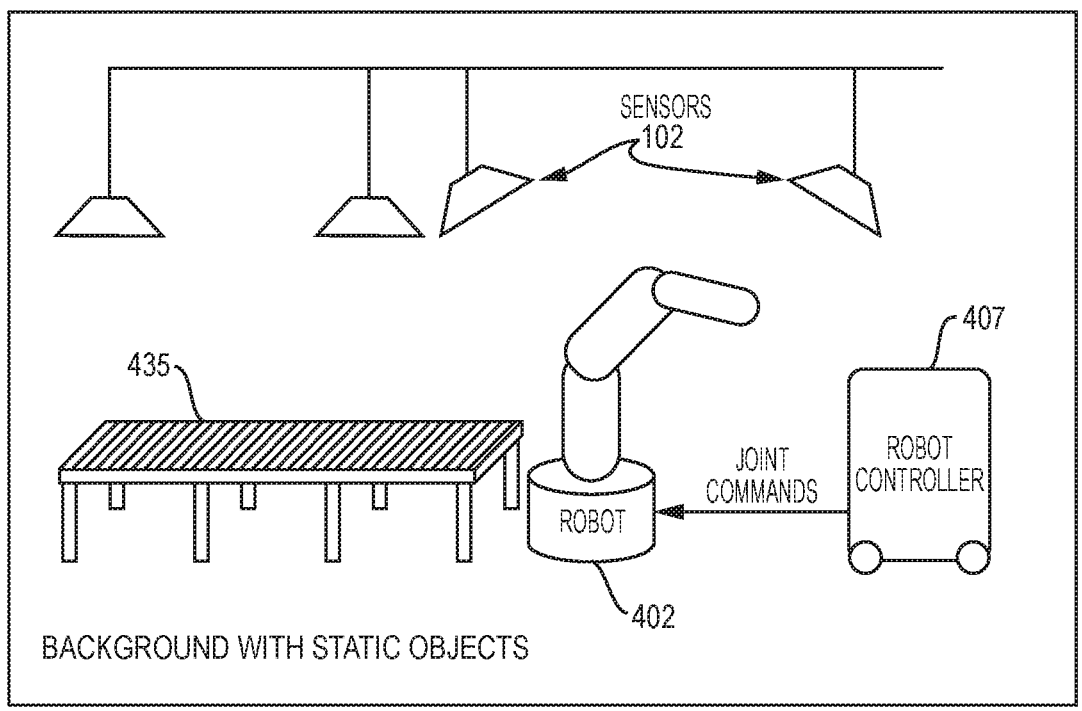
Figure 4C:
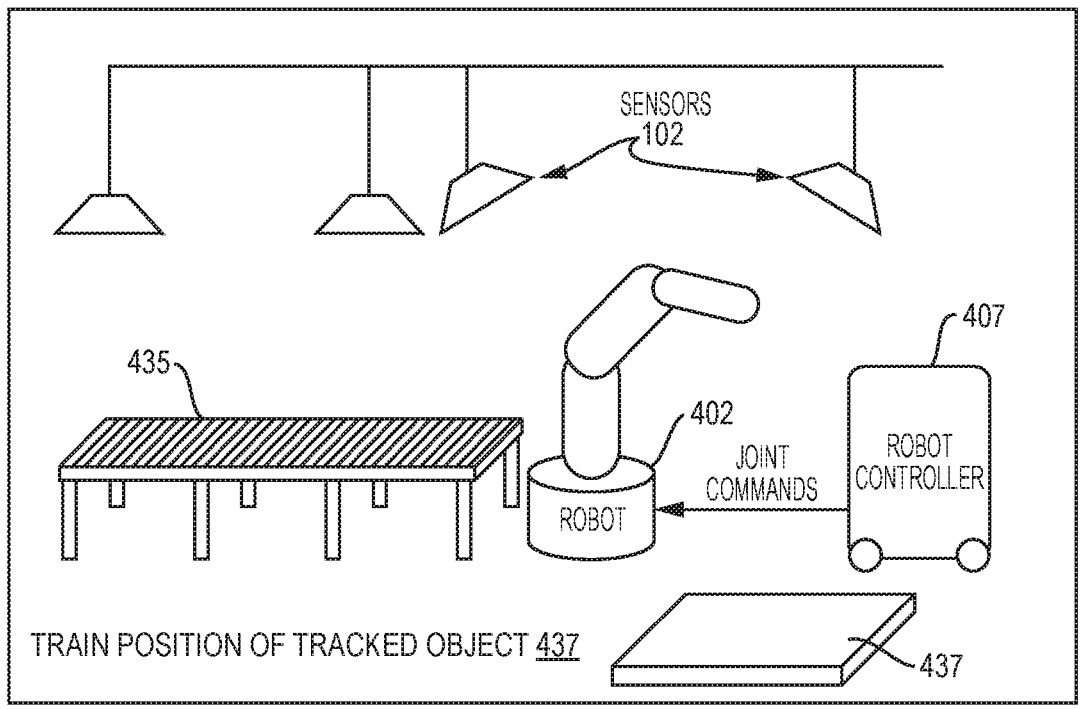
Figure 4D:
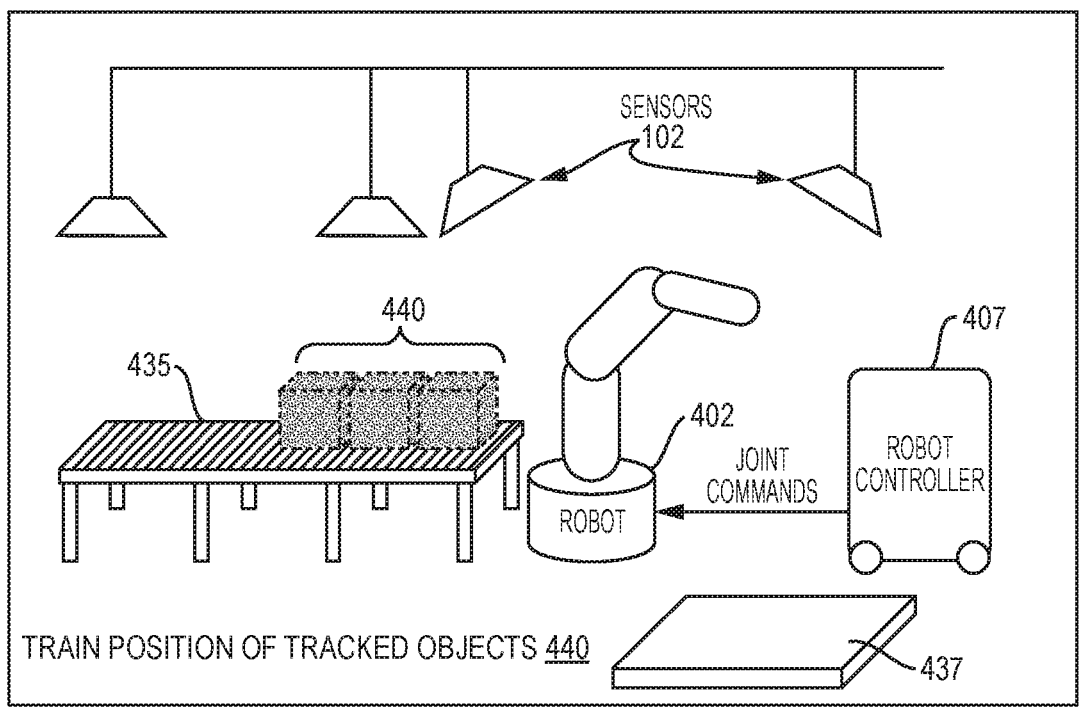
Figure 4E:
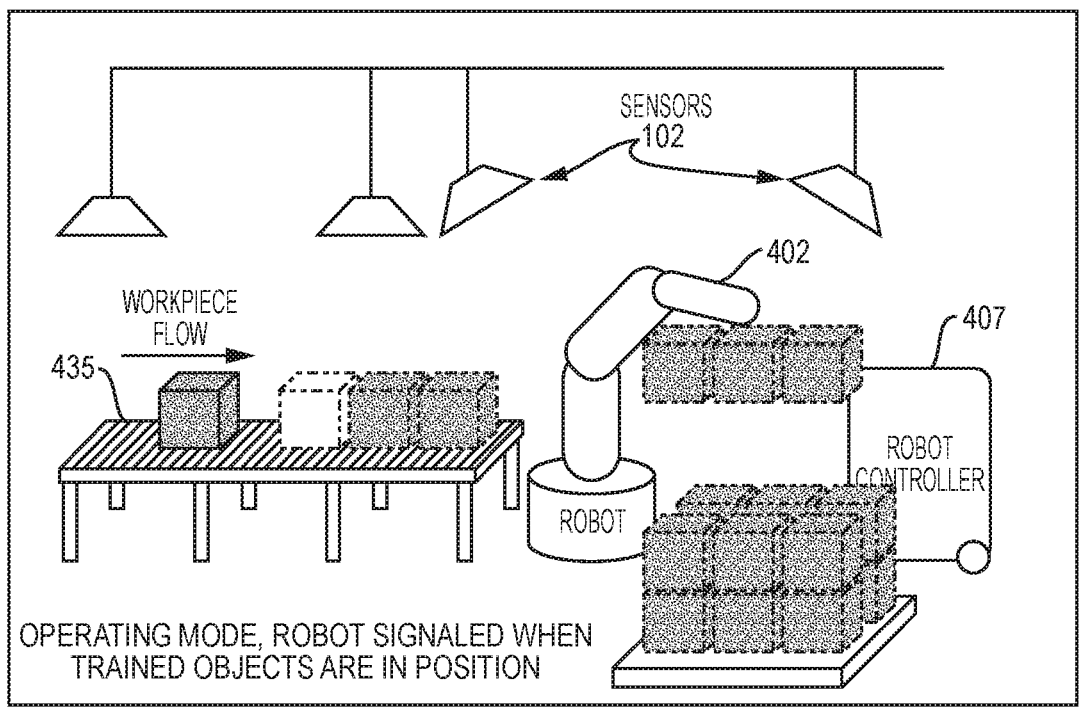

The training process and subsequent operation are illustrated in FIGS. 4B-4E for a palletizing application. In this sequential imaging process, visual understandings of the background and workpieces are developed separately. With reference to FIG. 4B, the sensors 102 capture an image of the static background including a conveyor 435. In FIG. 4C, a pallet 437 is placed in position and the sensors 102 obtain new images of the tracked area. Using background subtraction from the first image, the voxel representation of the pallet workpiece is identified and saved into memory 310. Then box workpieces 440 are placed in the desired robot pick position at the end of conveyor 435 (FIG. 4D). Sensors 102 again acquire images, and again using background subtraction from the first two images, the boxes 440 are identified as a collection of workpieces and saved into memory 310. As a result, when new boxes are transported on conveyor 435, they are not recognized as in proper position until three boxes are aligned and positioned as shown in FIG. 4D. In operation, as illustrated in FIG. 4E, when the predefined configuration of workpieces 400 is identified by object analysis module 415 (FIG. 4A), digital I/O is toggled based on configured logic, and robot controller 407 operates robot 402 to pick up the collection of three boxes 440 and move them to the placement position on pallet 437. Alternatively, information about workpiece configuration may be sent to robot 402 via industrial or real-time ethernet. Object analysis module 415 is able to distinguish between workpiece variants and signal to downstream equipment which workpieces are present. Individual I/O points may be mapped to each trained configuration.

During training, a user interface may be configured to capture 3D images of the workspace or portion thereof and identify, or allow the user to designate, volumes of interest in those images that represent workpieces. This may involve identifying workpieces by techniques such as background subtraction or image-to-image subtraction to isolate the voxels corresponding to the workpieces. For example, the user interface may present a series of user-facing tools enabling naming, grouping and modification of workpiece spatial representations. Workpiece representations may be imported to the system or exported by the system to facilitate reusability of the workpieces in different applications.

In greater detail, object analysis module 415 may analyze the sensor images and generate 3D point cloud data, which it may convert to a voxel-level representation of the workpieces 437, 440 following background subtraction. When new images are received by sensors 102 during operation, object analysis module 415 may convert these to voxel-level representations for comparison to the stored models (which also may be represented as, or converted to, voxels) to assess whether the sensed workpieces conform in alignment and position to the stored models within an allowed tolerance. For example, the sensed representation may be offset by a certain number of voxels to account for the desired level of misalignment tolerance. Alternatively, as noted above, workpiece position and alignment may be analyzed by running acquired sensor images through a neural network that has been trained using labeled images of properly aligned workpieces (with training images including variations spanning the tolerance range) and misaligned workpieces.

In a sequential or continuous mode where the workpiece representation takes the form of a sequence of models or frames, the model may be played back as the workpiece is processed to ensure proper workpiece positioning and alignment through the sequence rather than only before processing begins. For example, if filling a hopper with round objects is recorded in a continuous training mode, it may be played back during operation upon the firing of digital input. A digital output on the hopper-filling system is fired when filling begins. That output is provided to object analysis module 415, which begins playback of the recorded changing object state when the input is received and continuously compares input sensor images to the temporal model.

5.3 Determining Robot State

A robot state determination module (RSDM) 420 is responsive to data from sensors 102 and signals from the robot 402 and/or robot controller 407 to determine the instantaneous state of the robot. In particular, RSDM 420 determines the pose and location of robot 402 within workspace 400; this may be achieved using sensors 102, signals from the robot and/or its controller, or data from some combination of these sources. RSDM 420 may also determines the instantaneous velocity of robot 402 or any appendage thereof; in addition, knowledge of the robot's instantaneous joint accelerations or torques, or planned future trajectory may be needed in order to determine motion constraints for the subsequent cycle as described below. Typically, this information comes from robot controller 407, but in some cases may be inferred directly from images recorded by sensors 102 as described below.

For example, these data could be provided by the robot 402 or the robot controller 407 via a safety-rated communication protocol providing access to safety-rated data. The 3D pose of the robot may then be determined by combining provided joint positions with a static 3D model of each link to obtain the 3D shape of the entire robot 402.

In some cases, the robot may provide an interface to obtain joint positions that are not safety-rated, in which case the joint positions can be verified against images from sensors 102 (using, for example, safety-rated software). For example, received joint positions may be combined with static 3D models of each link to generate a 3D model of the entire robot 402. This 3D image can be used to remove any objects in the sensing data that are part of the robot itself. If the joint positions are correct, this will fully eliminate all object data attributed to the robot 402. If, however, the joint positions are incorrect, the true position of robot 402 will diverge from the model, and some parts of the detected robot will not be removed. Those points will then appear as a foreign object in the new cycle. In the previous cycle, it can be assumed that the joint positions were correct because otherwise robot 402 would have been halted. Since the base joint of the robot does not move, at least one of the divergent points must be close to the robot. The detection of an unexpected object close to robot 402 can then be used to trigger an error condition, which will cause control system 112 (see FIG. 1) to transition robot 402 to a safe state. Alternately, sensor data can be used to identify the position of the robot using a correlation algorithm, such as described above in the section on registration, and this detected position can be compared with the joint position reported by the robot. If the joint position information provided by robot 402 has been validated in this manner, it can be used to validate joint velocity information, which can then be used to predict future joint positions. If these positions are inconsistent with previously validated actual joint positions, the program can similarly trigger an error condition. These techniques enable use of a non-safety-rated interface to produce data that can then be used to perform additional safety functions.

Finally, RSDM 420 may be configured to determine the robot's joint state using only image information provided by sensors 102, without any information provided by robot 402 or controller 407 sensors 102. Given a model of all of the links in the robot, any of several conventional, well-known computer vision techniques can be used by RSDM 420 to register the model to sensor data, thus determining the location of the modeled object in the image. For example, the ICP algorithm (discussed above) minimizes the difference between two 3D point clouds. ICP often provides a locally optimal solution efficiently, and thus can be used accurately if the approximate location is already known. This will be the case if the algorithm is run every cycle, since robot 402 cannot have moved far from its previous position. Accordingly, globally optimal registration techniques, which may not be efficient enough to run in real time, are not required. Digital filters such as Kalman filters or particle filters can then be used to determine instantaneous joint velocities given the joint positions identified by the registration algorithm.

These image-based monitoring techniques often rely on being run at each system cycle, and on the assumption that the system was in a safe state at the previous cycle. Therefore, a test may be executed when robot 402 is started—for example, confirming that the robot is in a known, pre-configured "home" position and that all joint velocities are zero. It is common for automated equipment to have a set of tests that are executed by an operator at a fixed interval, for example, when the equipment is started up or on shift changes. Reliable state analysis typically requires an accurate model of each robot link. This model can be obtained a priori, e.g. from 3D CAD files provided by the robot manufacturer or generated by industrial engineers for a specific project. However, such models may not be available, at least not for the robot and all of the possible attachments it may have.

In this case, it is possible for RSDM 420 to create the model itself, e.g., using sensors 102. This may be done in a separate training mode where robot 402 runs through a set of motions, e.g., the motions that are intended for use in the given application and/or a set of motions designed to provide sensors 102 with appropriate views of each link. It is possible, but not necessary, to provide some basic information about the robot a priori, such as the lengths and rotational axes of each link. During this training mode, RSDM 420 generates a 3D model of each link, complete with all necessary attachments. This model can then be used by RSDM 420 in conjunction with sensor images to determine the robot state.

5.4 Determining Safe-Action Constraints

In traditional axis- and rate-limitation applications, an industrial engineer calculates what actions are safe for a robot, given the planned trajectory of the robot and the layout of the workspace—forbidding some areas of the robot's range of motion altogether and limiting speed in other areas. These limits assume a fixed, static workplace environment. Here we are concerned with dynamic environments in which objects and people come, go, and change position; hence, safe actions are calculated by a safe-action determination module (SADM) 425 in real time based on all sensed relevant objects and on the current state of robot 402, and these safe actions may be updated each cycle. In order to be considered safe, actions should ensure that robot 402 does not collide with any stationary object, and also that robot 402 does not come into contact with a person who may be moving toward the robot. Since robot 402 has some maximum possible deceleration, controller 407 should be instructed to begin slowing the robot down sufficiently in advance to ensure that it can reach a complete stop before contact is made.

Figure 5:
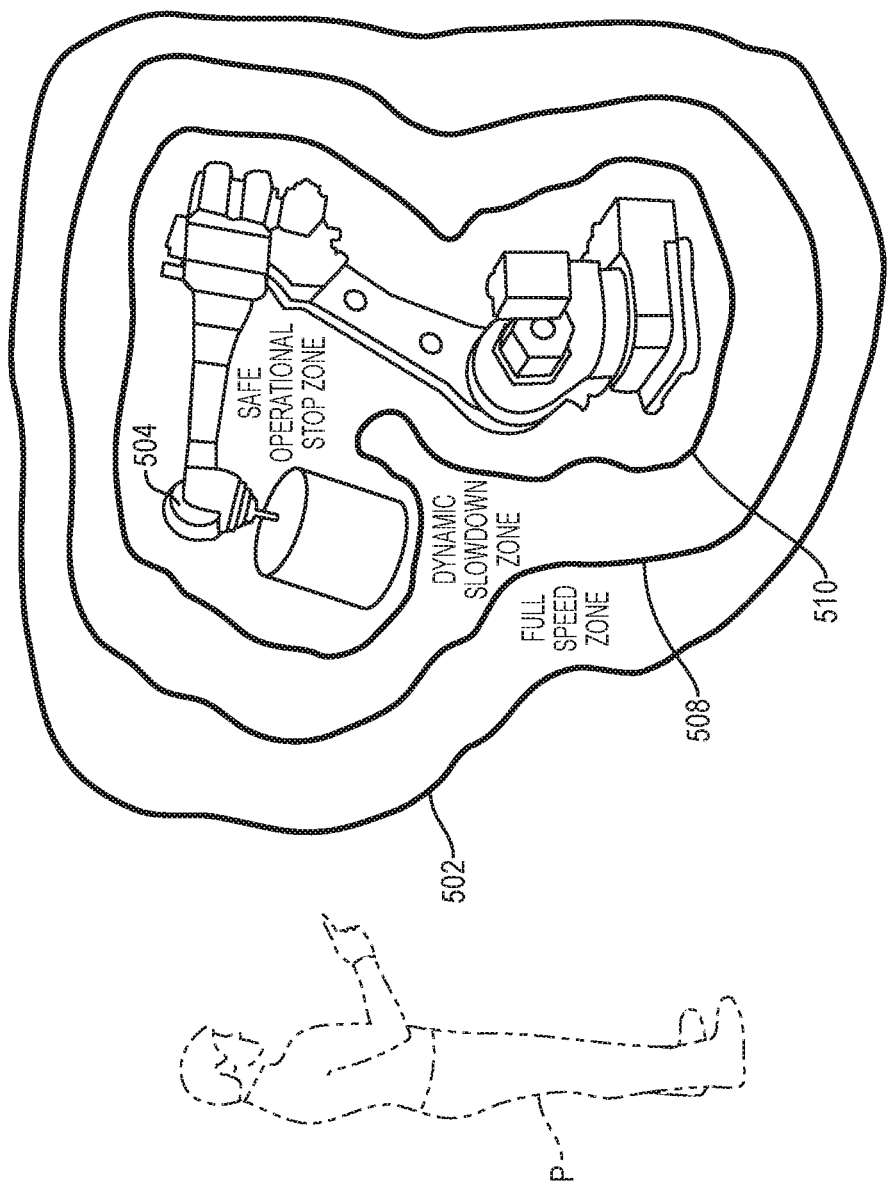
FIG. 5 schematically illustrates the definition of progressive safety envelopes in proximity to a piece of industrial machinery.

One approach to achieving this is to modulate the robot's maximum velocity (by which is meant the velocity of the robot itself or any appendage thereof) proportionally to the minimum distance between any point on the robot and any point in the relevant set of sensed objects to be avoided. The robot is allowed to operate at maximum speed when the closest object is further away than some threshold distance beyond which collisions are not a concern, and the robot is halted altogether if an object is within a certain minimum distance. Sufficient margin can be added to the specified distances to account for movement of relevant objects or humans toward the robot at some maximum realistic velocity. This is illustrated in FIG. 5. An outer envelope or 3D zone 502 is generated computationally by SADM 425 around the robot 504. Outside this zone 502, all movements of the person P are considered safe because, within an operational cycle, they cannot bring the person sufficiently close to the robot 504 to pose a danger. Detection of any portion of the person P's body within a second 3D zone 508, computationally defined within zone 502, is registered by SADM 425 but robot 504 is allowed to continue operating at full speed. If any portion of the person P crosses the threshold of zone 508 but is still outside an interior danger zone 510, robot 504 is signaled to operate at a slower speed. If any portion of the person P crosses into the danger zone 510—or is predicted to do so within the next cycle based on a model of human movement—operation of robot 504 is halted. These zones may be updated if robot 504 is moved (or moves) within the environment.

A refinement of this technique is for SADM 425 to control maximum velocity proportionally to the square root of the minimum distance, which reflects the fact that in a constant-deceleration scenario, velocity changes proportionally to the square root of the distance traveled, resulting in a smoother and more efficient, but still equally safe, result. A further refinement is for SADM 425 to modulate maximum velocity proportionally to the minimum possible time to collision—that is, to project the robot's current state forward in time, project the intrusions toward the robot trajectory, and identify the nearest potential collision. This refinement has the advantage that the robot will move more quickly away from an obstacle than toward it, which maximizes throughput while still correctly preserving safety. Since the robot's future trajectory depends not just on its current velocity but on subsequent commands, SADM 425 may consider all points reachable by robot 402 within a certain reaction time given its current joint positions and velocities, and cause control signals to be issued based on the minimum collision time among any of these states. Yet a further refinement is for SADM 425 to take into account the entire planned trajectory of the robot when making this calculation, rather than simply the instantaneous joint velocities. Additionally, SADM 425 may, via robot controller 407, alter the robot's trajectory, rather than simply alter the maximum speed along that trajectory. It is possible to choose from among a fixed set of trajectories one that reduces or eliminates potential collisions, or even to generate a new trajectory on the fly.

While not necessarily a safety violation, collisions with static elements of the workspace are generally not desirable. The set of relevant objects can include all objects in the workspace, including both static background such as walls and tables, and moving objects such as workpieces and human workers. Either from prior configuration or run-time detection, sensors 102 and analysis module 342 may be able to infer which objects could possibly be moving. In this case, any of the algorithms described above can be refined to leave additional margins to account for objects that might be moving, but to eliminate those margins for objects that are known to be static, so as not to reduce throughput unnecessarily but still automatically eliminate the possibility of collisions with static parts of the work cell.

Beyond simply leaving margins to account for the maximum velocity of potentially moving objects, state estimation techniques based on information detected by the sensing system can be used to project the movements of humans and other objects forward in time, thus expanding the control options available to control routines 350. For example, skeletal tracking techniques can be used to identify moving limbs of humans that have been detected and limit potential collisions based on properties of the human body and estimated movements of, e.g., a person's arm rather than the entire person.

5.5 Communicating Safe Action Constraints to the Robot

The safe-action constraints identified by SADM 425 may be communicated by OMS 410 to robot controller 407 on each cycle via a robot communication module 430. As described above, communication modules may correspond to an I/O port 327 interface to a complementary port on robot controller 407 or may correspond to transceiver 325. Most industrial robots provide a variety of interfaces for use with external devices. A suitable interface should operate with low latency at least at the control frequency of the system. The interface can be configured to allow the robot to be programmed and run as usual, with a maximum velocity being sent over the interface. Alternatively, some interfaces allow for trajectories to be delivered in the form of waypoints. Using this type of an interface, the intended trajectory of robot 402 can be received and stored within OMS 410, which may then generate waypoints that are closer together or further apart depending on the safe-action constraints. Similarly, an interface that allows input of target joint torques can be used to drive trajectories computed in accordance herewith. These types of interface can also be used where SADM 425 chooses new trajectories or modifies trajectories depending on the safe-action constraints.

As with the interface used to determine robot state, if robot 402 supports a safety-rated protocol that provides real-time access to the relevant safety-rated control inputs, this may be sufficient. However, a safety-rated protocol is not available, additional safety-rated software on the system can be used to ensure that the entire system remains safe. For example, SADM 425 may determine the expected speed and position of the robot if the robot is operating in accordance with the safe actions that have been communicated. SADM 425 then determines the robot's actual state as described above. If the robot's actions do not correspond to the expected actions, SADM 425 causes the robot to transition to a safe state, typically using an emergency stop signal. This effectively implements a real-time safety-rated control scheme without requiring a real-time safety-rated interface beyond a safety-rated stopping mechanism.

In some cases a hybrid system may be optimal—many robots have a digital input that can be used to hold a safety-monitored stop. It may be desirable to use a communication protocol for variable speed, for example, when intruding objects are relatively far from the robot, but to use a digital safety-monitored stop when the robot must come to a complete stop, for example, when intruding objects are close to the robot.

Certain embodiments of the present invention are described above. It is, however, expressly noted that the present invention is not limited to those embodiments; rather, additions and modifications to what is expressly described herein are also included within the scope of the invention.

What is claimed is:

1. A system for identifying a workpiece in a processing environment, the system comprising:
    at least one sensor for digitally recording visual information, the at least one sensor being positioned to record a plurality of images of the workpiece in the processing environment;
    a computer memory for storing a digital model of the workpiece, wherein (i) the digital model includes representations of multiple discrete, sequential states of a production process and (ii) each state of the production process requires a different specified position and orientation of the workpiece; and
    a processor configured to determine, from the plurality of recorded images and the stored digital model, whether the workpiece conforms to the different position and orientation specified in each state of the production process.

2. The system of claim 1, wherein the digital model includes a general 3D representation of the workpiece and a specific 3D representation of the workpiece in the specified position and orientation for each state of the production process.

3. The system of claim 1, wherein the processor is configured to computationally generate, from each recorded image, a 3D spatial representation of the workpiece.

4. The system of claim 1, wherein the processor is further configured to generate a 3D voxel-grid volumetric representation of at least a portion of the processing environment.

5. The system of claim 1, wherein the computer memory stores digital models of a plurality of workpieces, the processor being further configured to recognize a workpiece based on at least one recorded image and comparison thereof to the stored digital models.

6. The system of claim 5, wherein each of the digital models include offset boundaries.

7. The system of claim 6, wherein the offset boundaries account for workpiece variations.

8. The system of claim 1, wherein the digital model is a CAD representation.

9. The system of claim 1, wherein the digital model is a machine-learning representation.

10. A method for identifying a workpiece in a processing environment, the method comprising the steps of:
digitally recording a plurality of images of the workpiece in the processing environment;
storing a digital model of the workpiece, wherein (i) the digital model includes representations of multiple discrete, sequential states of a production process and (ii) each state of the production process requires a different specified position and orientation of the workpiece; and
computationally determining, from the plurality of recorded images and the stored digital model, whether the workpiece conforms to the different position and orientation specified in each state of the production process, and only if so, processing the workpiece.

11. The method of claim 10, wherein the digital model includes a general representation of the workpiece and a specific representation of the workpiece in the specified position and orientation for each state of the production process.

12. The method of claim 11, wherein the digital model is a CAD representation.

13. The method of claim 11, wherein the digital model is a machine-learning representation.

14. The method of claim 11, wherein the digital model of the workpiece is created according to steps comprising:
removing all non-workpiece objects from the processing environment;
digitally recording an image of the processing environment as at least one background image;
physically moving a workpiece into the processing environment;
digitally recording an image of the workpiece in the position and orientation specified in a state of the production process;
subtracting the background image from the image of the workpiece in the position and orientation specified in the state of the production process to produce a difference image; and
storing the difference image as a portion of the digital model of the workpiece.

15. The method of claim 10, further comprising the step of computationally generating, from at least one recorded image, a 3D spatial representation of the workpiece.

16. The method of claim 10, further comprising the step of generating a 3D voxel-grid volumetric representation of at least a portion of the processing environment.

17. The method of claim 10, wherein digital models of a plurality of workpieces are stored, and further comprising the step of computationally recognizing a workpiece based on at least one recorded image and comparison thereof to the stored digital models.

18. The method of claim 17, wherein each of the digital models includes offset boundaries.

19. The method of claim 18, wherein the offset boundaries account for workpiece variations.

* * * * *